United States Patent [19]

Arai et al.

[11] Patent Number: 5,332,341
[45] Date of Patent: Jul. 26, 1994

[54] PRESSURE FOOT OF PRINTED CIRCUIT BOARD DRILLING APPARATUS

[75] Inventors: Kunio Arai, Atsugi; Yasuhiko Kanaya, Machida; Kazunori Hamada, Inagi, all of Japan

[73] Assignee: Hitachi Seiko Ltd., Japan

[21] Appl. No.: 966,192

[22] PCT Filed: May 28, 1992

[86] PCT No.: PCT/JP92/00690

§ 371 Date: Jan. 29, 1993

§ 102(e) Date: Jan. 29, 1993

[87] PCT Pub. No.: WO92/21481

PCT Pub. Date: Dec. 10, 1992

[30] Foreign Application Priority Data

May 30, 1991 [JP] Japan .................. 3-127539
Mar. 13, 1992 [JP] Japan .................. 4-054686

[51] Int. Cl.$^5$ ............................................. B23B 47/00
[52] U.S. Cl. .................................... 408/61; 408/67; 408/95
[58] Field of Search ............ 408/1 R, 56, 61, 67, 408/95

[56] References Cited

U.S. PATENT DOCUMENTS

| | | | |
|---|---|---|---|
| 2,650,557 | 9/1953 | Hauser | 408/61 |
| 3,398,609 | 8/1968 | Schott | 408/61 |
| 3,478,843 | 11/1969 | Eckardt | 408/61 |
| 3,577,808 | 5/1971 | Visser . | |
| 4,037,982 | 7/1977 | Clement | 408/61 |
| 4,915,550 | 4/1990 | Arai et al. | 408/67 |
| 4,917,547 | 4/1990 | Frederickson et al. | 408/61 |
| 5,213,454 | 5/1993 | Givler et al. | 408/67 |

FOREIGN PATENT DOCUMENTS

| | | |
|---|---|---|
| 47-10318 | 3/1972 | Japan . |
| 200902 | 8/1988 | Japan .................. 408/95 |
| 63-300807 | 12/1988 | Japan . |
| 3-3713 | 1/1991 | Japan . |
| 201008 | 7/1992 | Japan .................. 408/95 |

Primary Examiner—Daniel W. Howell
Attorney, Agent, or Firm—Evenson, McKeown, Edwards & Lenahan

[57] ABSTRACT

A pressure foot (7) of a printed circuit board drilling apparatus is supported on a spindle (2) of the printed circuit board drilling apparatus slidably in the axial direction, and includes a pressing face (13) which presses a printed circuit board (5) at the time of drilling operation, a discharge port (11) formed in a side wall (8) so as to discharge chips produced by drilling operation, the discharge port (11) being connected to a suction device, and a compressed air supply conduit (20A) formed in a side wall so as to eject the compressed air toward a drill bit (4) of the printed circuit board drilling apparatus. A cooling fluid supply device (21) is connected to the compressed air supply conduit (20A). In place of the compressed air supply conduit (20A), a fluid supply conduit (14) for ejecting a cooling fluid toward the drill bit (4) of the printed circuit board drilling apparatus may be formed. In this case, at least one groove (18) extending in a tangential direction of the drill bit is formed in the pressing face (13) so as to allow the air to be drawn into an inside (10) of the pressure foot. Thus, cooling efficiency of the drill bit at the time of drilling operation can be enhanced.

1 Claim, 5 Drawing Sheets

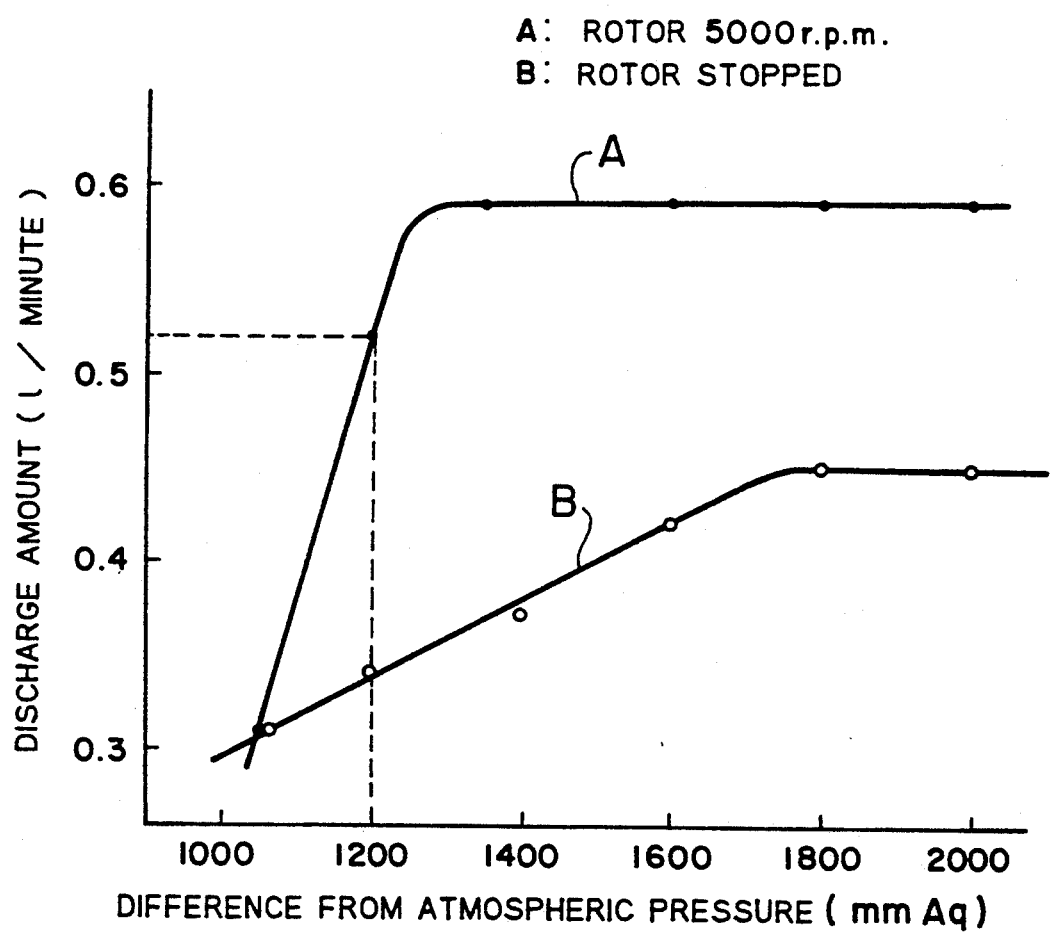

PRESSURE FOOT OF PRINTED CIRCUIT BOARD DRILLING APPARATUS

TECHNICAL FIELD

The present invention relates to a pressure foot of a printed circuit board drilling apparatus and, more particularly, to a pressure foot of a printed circuit board drilling apparatus for improving the cooling efficiency of a drill bit.

BACKGROUND ART

As a pressure foot of a printed circuit board drilling apparatus for drilling printed circuit boards, for instance, pressure feet disclosed in Japanese Patent Unexamined Publication No. 63-300807, Japanese Patent Unexamined Publication No 3-3713 (corresponding to U.S. Pat. No. 5024562), and so forth have been proposed.

These pressure feet are designed such that compressed gas is ejected toward a drill bit from a groove formed in a lower end portion of the pressure foot, and that the drill bit is cooled by the compressed gas.

Increasing the machining speed and decreasing the frequency of replacement of the drill bit are expected for enhancing the productivity. Improving the quality of drilled holes is expected for responding to an increase in accuracy of equipments in which printed circuit boards are used, and suppressing generation of offensive odor caused by burning of printed circuit boards is expected for improving the operation environment.

They are subject matters which can be solved by increasing the cooling efficiency of the drill bit. In the prior art, however, cooling of the drill bit is effected by heat conduction through the compressed gas injected into the pressure foot, and consequently, it is impossible to expect the cooling efficiency of the drill bit to be largely enhanced.

DISCLOSURE OF THE INVENTION

An object of the present invention is to provide a pressure foot of a printed circuit board drilling apparatus which can improve the cooling efficiency of a drill bit considerably and can solve the above-described subject matters.

A first embodiment of a pressure foot of a printed circuit board drilling apparatus according to the present invention, which is supported on a spindle of the printed circuit board drilling apparatus slidably in the axial direction, and which includes a pressing face which presses a printed circuit board at the time of drilling operation, a discharge port formed in a side wall so as to discharge chips produced by drilling operation, the discharge port being connected to a suction device, and a compressed air supply conduit formed in a side wall so as to eject the compressed air toward a drill bit of the printed circuit board drilling apparatus, is characterized in that a cooling fluid supply device is connected to the compressed air supply conduit.

A cooling fluid atomizing nozzle can be employed as the cooling fluid supply device. The cooling fluid atomizing nozzle comprises an outer pipe with a spout, an inner pipe which is inserted in the outer pipe so as to form an annular compressed air conduit between the inner surface of the outer pipe and the inner pipe, and which includes a cooling fluid conduit formed therein and an opening portion opened toward the spout, and a needle member which is inserted in the inner pipe movably in the axial direction, and which controls an opening area of the opening portion of the inner pipe.

Preferably, the supply conduit should extend in a tangential direction of the drill bit.

A second embodiment of a pressure foot of a printed circuit board drilling apparatus according to the invention, which is supported on a spindle of the printed circuit board drilling apparatus slidably in the axial direction, and which includes a pressing face which presses a printed circuit board at the time of drilling operation, and a discharge port formed in a side wall so as to discharge chips produced by drilling operation, the discharge port being connected to a suction device, is characterized in that a fluid supply conduit for ejecting a cooling fluid toward a drill bit of the printed circuit board drilling apparatus is formed in the side wall, and that at least one groove extending in a tangential direction of the drill bit is formed in the pressing face so as to allow the air to be drawn into the pressure foot.

Preferably, the fluid supply conduit should extend in a tangential direction of the drill bit.

In the first embodiment, the suction device is operated to start suction of the air in the pressure foot. At the same time, the cooling fluid is supplied from the cooling fluid supply device, and also, the compressed air is supplied. Thus, the cooling fluid is atomized and mixed in the compressed air. The atomized cooling fluid is supplied, with the compressed air, through the supply conduit and ejected toward the drill bit. In this condition, the drill bit is rotated, and the spindle is moved downwardly, to thereby drill bit the printed circuit board.

When the temperature of the drill bit is increased owing to drilling of the printed circuit board, the atomized cooling fluid comes into contact with the drill bit and is vaporized. By the heat of vaporization thereof, the drill bit is cooled. Since the vaporized cooling fluid and drilling chips are discharged from the discharge port, they will not remain on the printed circuit board.

In the second embodiment, the suction device is operated to start suction of the air in the pressure foot. Also, a predetermined amount of the cooling fluid is supplied from the cooling fluid supply device. Thus, riding on flows of the air drawn into the suction device, the cooling fluid is supplied through the supply conduit and ejected toward the drill bit. In this condition, the drill bit is rotated, and the spindle is moved downwardly, to thereby drill bit the printed circuit board. At this time, the pressure foot is engaged with the printed circuit board, and only the supplied cooling fluid and the air drawn from the groove exist inside of the pressure foot, so that the pressure in the pressure foot becomes negative. As a result, the cooling fluid is atomized. When the temperature of the drill bit is increased owing to drilling of the printed circuit board, the atomized cooling fluid comes into contact with the drill bit and is vaporized. By the heat of vaporization thereof, the drill bit is cooled. Since the vaporized cooling fluid and drilling chips are discharged from the discharge port, they will not remain on the printed circuit board.

In the present invention, as described above, because fluid is used as the coolant, and especially because the heat of vaporization of the fluid is utilized for cooling the drill bit, cooling efficiency of the drill bit can be considerably improved. Consequently, it is possible to increase the machining speed, to decrease the frequency of replacement of the drill bit, and to enhance the productivity. Moreover, it is possible to improve the quality of drilled holes. Furthermore, it is possible to suppress generation of offensive odor caused by burning of printed circuit boards and to improve the operation environment.

BRIEF DESCRIPTION OF THE DRAWINGS

FIG. 9 is a graph illustrative of a relation between a drawing force of a suction device and a supply amount of a cooling fluid to prevent the cooling fluid from remaining on a printed circuit board.

BEST MODE FOR CARRYING OUT THE INVENTION

A first embodiment of a pressure foot for a printed circuit board drilling apparatus according to the present invention will now be described with reference to FIGS. 1 to 3.

Figure 1:
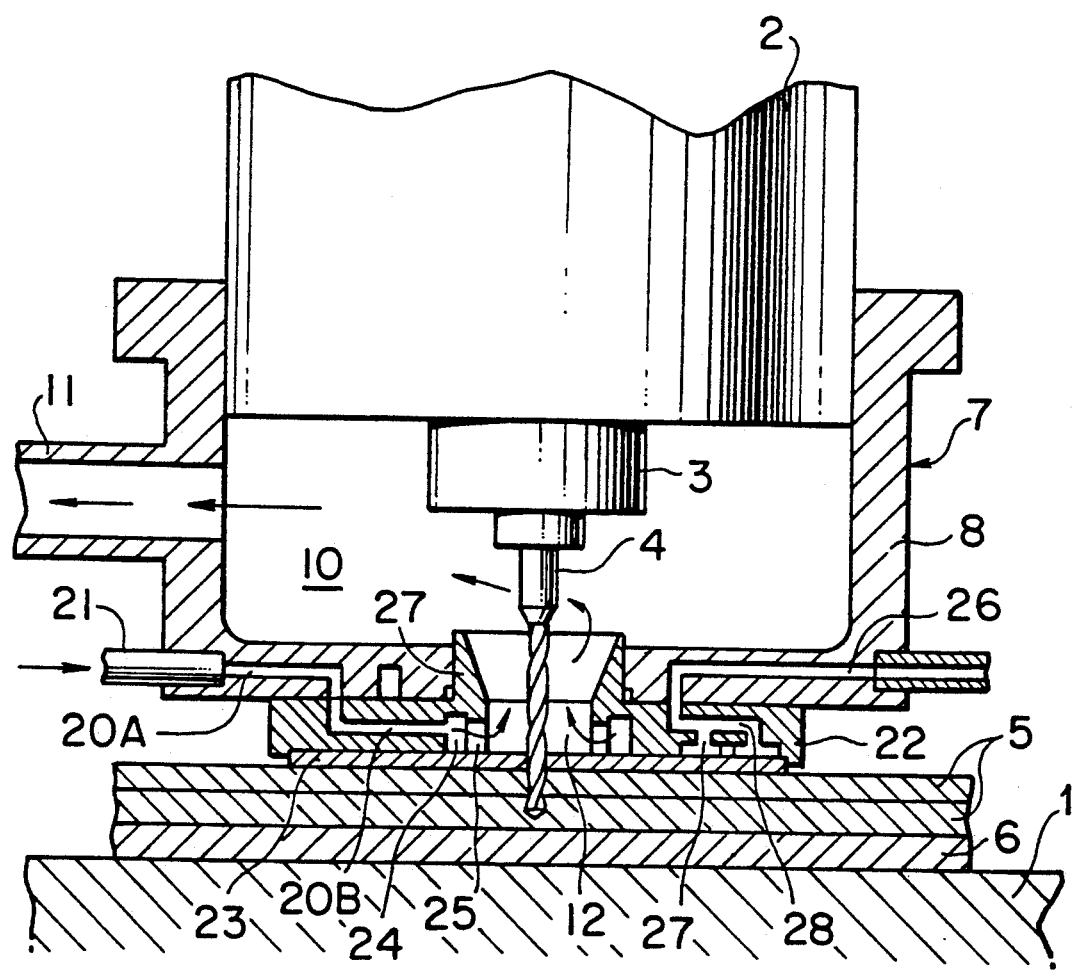
FIG. 1 is a front cross-sectional view showing a first embodiment of a pressure foot of a printed circuit board drilling apparatus according to the present invention in a condition at the time of drilling.
Figure 2:
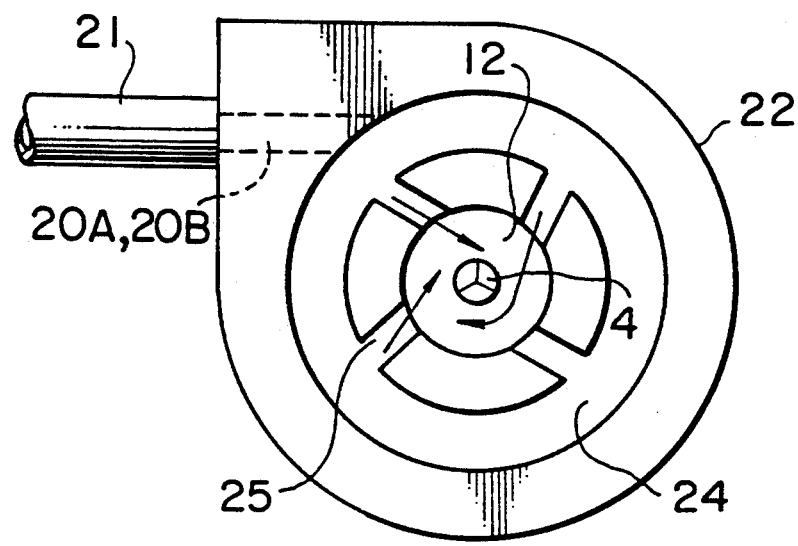
FIG. 2 is a bottom view showing an end bush which is attached to an end portion of the pressure foot.

Referring to FIG. 1, a printed circuit board 5, with a lower plate 6, is securely fixed on a table 1. The table 1 is mounted on a frame (not shown) of the printed circuit board drilling apparatus so as to be movable in the X direction (in a direction perpendicular to the surface of the drawing). A spindle 2 of the printed circuit board drilling apparatus is mounted to be movable in the Y direction (in a left and right direction of the drawing) and in the Z direction (in a up and down direction of the drawing) by drive means not shown. A rotor 3 is rotatably supported on the spindle 2 and rotatingly driven by a motor not shown. A drill bit 4 is detachably attached to a chuck (not shown) incorporated in the rotor 3.

A pressure foot 7 is supported on the spindle 2 slidably in the axial direction of the spindle. At the time of machining, the pressure foot is forced downwardly by a hydraulic cylinder not shown so as to press the printed circuit board 5. The pressure foot 7 has a substantially cup-like shape. A discharge port 11 is formed in a side wall portion 8 of the pressure foot and connected to a suction device not shown so as to discharge chips produced as a result of drilling operation to the outside. An opening is formed in the center of a bottom portion of the pressure foot, and an end bush 22 is fitted in the opening. A compressed air supply conduit 20A and a vacuum supply conduit 26 connected to a vacuum device not shown are formed at the bottom portion of the pressure foot 7. The compressed air supply conduit 20A is connected with a compressed air source not shown and a cooling fluid supply device 21.

A through hole 12 is formed in a central portion of the end bush 22 so that the drill bit is reciprocated therein. Also, a conduit 20B communicating with the compressed air supply conduit 20A is formed in the end bush 22. The conduit 20B communicates with an annular groove 24 formed so as to surround the through hole 12. The annular groove 24 is formed to extend in a substantially tangential direction of the drill bit 4 and communicates with a plurality of grooves 25 opened to the through hole 12.

Further, a conduit 28 communicating with the vacuum supply conduit 26 is formed in the end bush 22, and the conduit 28 is opened at an opening portion 27 of the lower surface of the end bush 22. A support plate 23 made of aluminum is attracted to the lower surface of the end bush 22 by vacuum supplied through the vacuum supply conduit 26, the conduit 28 and the opening portion 27.

Figure 3:
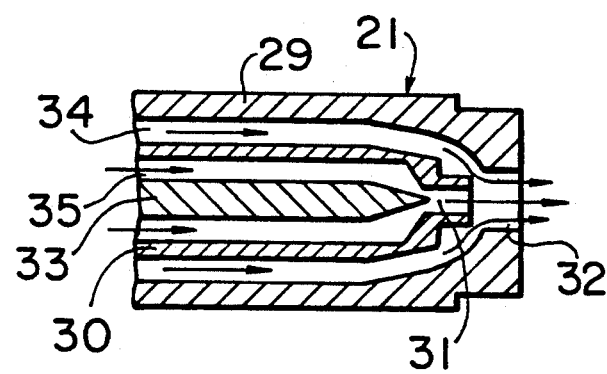
FIG. 3 is a cross-sectional view of a cooling fluid atomizing nozzle.

As shown in FIG. 3, a cooling fluid atomizing nozzle can be employed as the cooling fluid supply device 21. The atomizing nozzle 21 comprises an outer pipe 29 with an injection spout 32, an inner pipe 30 which is inserted in the outer pipe 29 so as to form an annular compressed air conduit 34 between the inner surface of the outer pipe 29 and the inner pipe, and which includes a cooling fluid conduit 35 formed therein and an opening portion 31 opened to the ejection spout 32, and a needle member 33 which is inserted in the inner pipe 30 movably in the axial direction, and which controls an opening area of the opening portion 31 of the inner pipe 30.

Then operation will be explained. The pressure foot 7 is moved downwardly to bring the support plate 23 into contact with the printed circuit board. The suction device connected to the discharge port 11 is operated to start suction of the air in the pressure foot 7. Further, the compressed air is supplied into the through hole 12 by way of the supply conduits 20A, 20B, the annular groove 24 and the grooves 25. By sucking the air and supplying the compressed air, highspeed air flows are generated in the pressure foot 7, circle around the drill bit 4, and reach the discharge port 11. The needle member 33 of the cooling fluid atomizing nozzle 21 is displaced to a predetermined extent, and the opening portion 31 is opened. As a result, cooling fluid is atomized in the compressed air, and the cooling fluid is supplied through the supply conduits 20A, 20B, the annular groove 24 and the grooves 25 and ejected toward the drill bit 4. In this condition, the drill bit 4 is rotated, and the spindle 2 is moved downwardly, to thereby drill bit the printed circuit board 5.

When the temperature of the drill bit 4 is increased owing to drilling of the printed circuit board 5, the atomized cooling fluid blown with the compressed air from the grooves 25 is vaporized by the heat of the drill bit 4. By the heat of vaporization thereof, the drill bit 4 is cooled. Further, by the high-speed air flows, the vaporized cooling fluid and produced chips are discharged out of the pressure foot from the discharge port 11. As obviously understood from FIG. 1, the support plate 23 for preventing generation of burrs contributes to prevent the cooling fluid from remaining on the printed circuit board 5. However, by controlling the amount of supply of the cooling fluid, it is also possible to prevent the cooling fluid from remaining on the printed circuit board 5.

In this embodiment, because a fluid is used as the coolant, and especially because the heat of vaporization of the fluid is utilized for cooling the drill bit, cooling efficiency of the drill bit can be considerably improved.

Next, a second embodiment of a pressure foot for a printed circuit board drilling apparatus according to the invention will be described with reference to FIGS. 4 to 9.

A pressure foot 7 includes a small-diameter pressing portion 9 which presses the periphery of a drilling position of a printed circuit circuit board 5. The pressing portion 9 comprises a through hole 12 through which a drill bit 4 is passed, a pressing face 13 to be brought into contact with the printed circuit board 5, a supply conduit 14 of a cooling fluid, a nozzle 15 connected to the supply conduit 14, and a spout 16 opened to the through hole 12 in a tangential direction of the drill bit 4. A supply port 17 is formed on one end of the supply conduit 14 so as to be connected to a cooling fluid supply device not shown.

Figure 6:
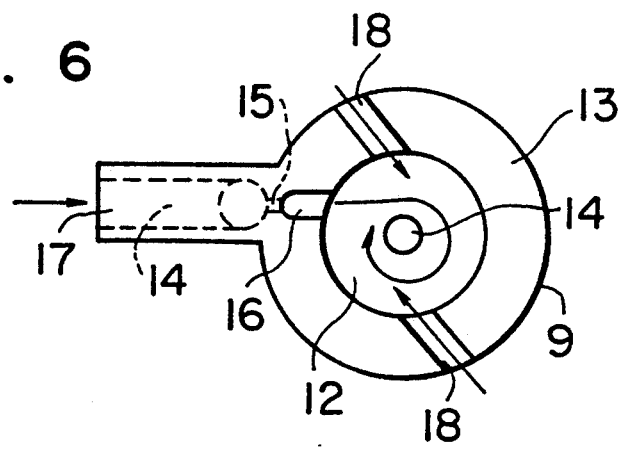
FIG. 6 is a bottom view showing the second embodiment of the pressure foot.

Further, as shown in FIG. 6, the pressing face 13 is formed with grooves 18 extending in tangential directions of the drill bit 4.

Then operation will be explained. The drill bit 4 is rotated, and also, a suction device is operated to draw the air in an inside 10 of the pressure foot 7 through the discharge port 11. As a result, the pressure in the inside 10 of the pressure foot 7 is decreased so that the air is drawn into the inside 10 of the pressure foot 7 from the through hole 12, thus generating high-speed air flows. In this condition, the cooling fluid supply device is operated to supply the cooling fluid to the supply conduit 14 by way of the supply port 17. Then, the cooling fluid is fed through the nozzle 15 and ejected from the spout 16 toward the drill bit 4. At this time, the pressure in the through hole 12 is lower than the atmospheric pressure, and the cooling fluid is passed from the small-diameter nozzle 15 to the spout 16 having a larger diameter. Consequently, the cooling fluid is ejected in atomized condition. Besides, since the cooling fluid is injected from the injection spout 16 into the high-speed air flows, it is further atomized and injected into the through hole 12.

Figure 4:
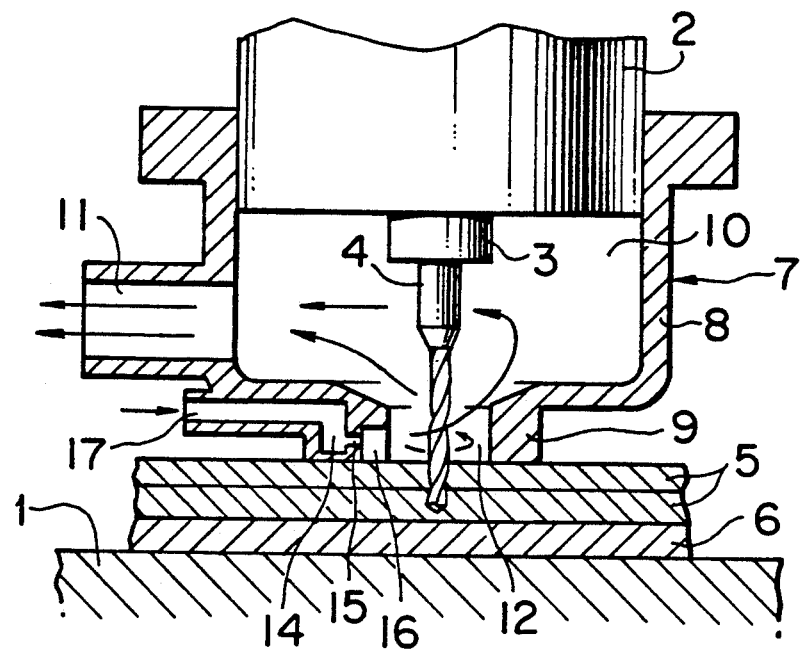
FIG. 4 is a front cross-sectional view showing a second embodiment of a pressure foot of a printed circuit board drilling apparatus according to the invention in a condition at the time of drilling.
Figure 5:
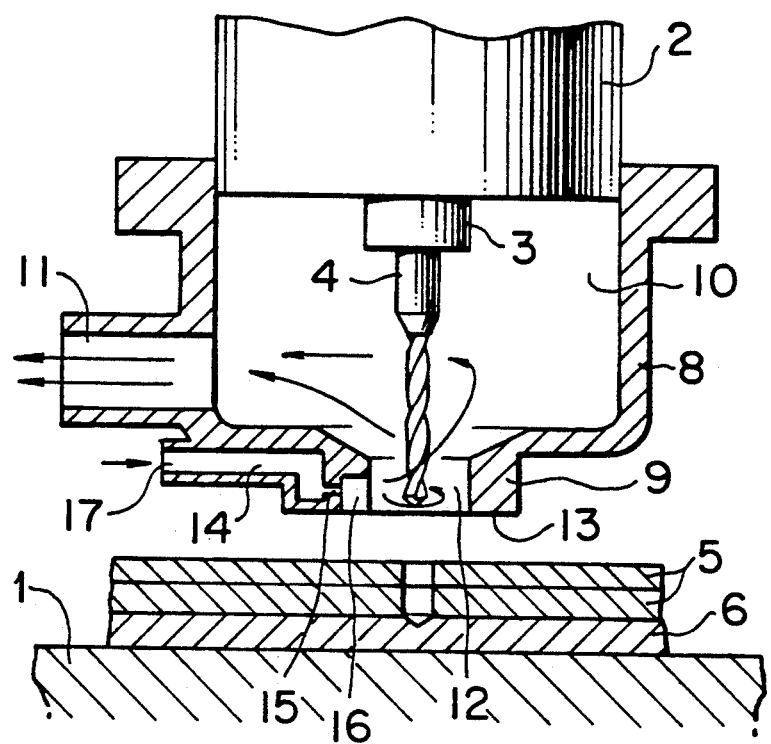
FIG. 5 is a front cross-sectional view showing the second embodiment of the pressure foot in a condition after drilling.

In such a condition, a spindle 2 is moved downwardly, and the pressing face 13 is brought into contact with the printed circuit board 5, so as to perform drilling of the printed circuit board 5, as shown in FIG. 4. At this time, the through hole 12 is closed by the printed circuit board 5, and therefore, the air is drawn into the pressure foot 7 by way of the grooves 18. Since the spout 16 and the grooves 18 face to the tangential directions of the drill bit 4, whirling air flows along a lead groove of the drill bit 4 are generated inside of the through hole 12. By these whirling air flows, chips produced as a result of drilling and chips attached to the drill bit 4 are blown out. Further, the atomized cooling fluid comes into contact with the drill bit 4 and vaporized, thereby cooling the drill bit 4.

FIG. 9 is a graph of experimental data illustrative of a relation between the drawing force of the suction device and the amount of supply of the cooling fluid to prevent the cooling fluid from remaining on the printed circuit board. For example, the graph shows that, in the case where the rotational speed of a rotor, i.e., the drill bit, is 5000 r.p.m., and the pressure in the pressure foot and the atmospheric pressure have difference of 1200 mmAq, when the supply amount of the cooling fluid is set at not more than 0.52 l/minute, the cooling fluid will not remain on the printed circuit board after the drilling operation. A difference between curves A and B is caused by the fact that the air flows are accelerated due to a turbine effect induced by rotation of the rotor. In consequence, when the drawing force of the suction device and the supply amount of the cooling fluid are controlled in accordance with the curves shown in FIG. 9, the cooling fluid will be all discharged and not remain on the printed circuit board.

Figure 7:
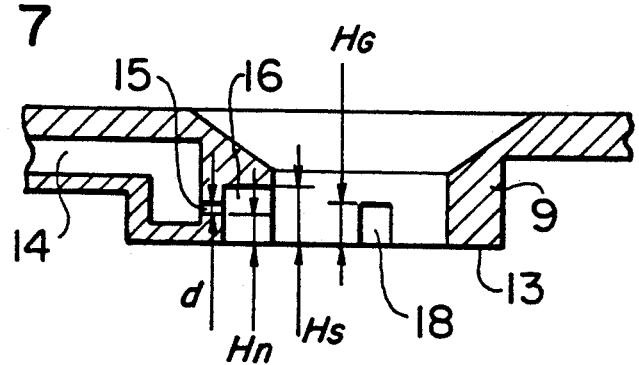
FIG. 7 is a vertical cross-sectional view of the second embodiment of the pressure foot, showing a cooling fluid supply conduit.
Figure 8:
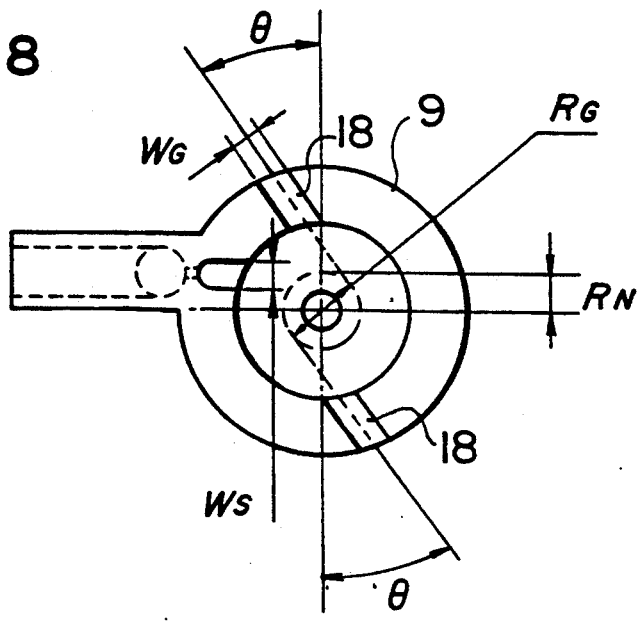
FIG. 8 is a bottom view of the pressure foot, showing one example of positional relation between the cooling fluid supply conduit and a groove.

In the above-described second embodiment, when the nozzle 15 and the spout 16 are designed to have the following dimensions as shown in FIGS. 7 and 8:

a height Hn of the nozzle 15 from the pressing face 13 which is 1 to 2 mm;

a diameter d of the nozzle 15 which is 1 mm;

a width Ws of the spout 16 which is 1 to 2 mm; and a height of Hs of the spout 16 which is 2 to 3 mm, it is preferable to set an ejecting direction of the cooling fluid from the spout 16 in a tangential direction of a circle having a radius (Rn) of 0.5 to 3 mm about the center which is the axial center of the drill bit 4. Moreover, when the ejecting direction of the cooling fluid is set with the above-mentioned radius Rn being 1 to 1.5 mm, the cooling effect can be enhanced to the largest degree.

It should be noted that the dimensions of the nozzle 15 and the spout 16 will not be limited to the above-described example but can be set at desired values.

Also, when the grooves 18 are designed to have the following dimensions:

a groove width Wg of 1.5 mm; and a groove depth Hg of 2.5 mm, it is preferable to set an angle $\theta$ shown in FIG. 8 50 to 70 degrees and the grooves to extend along tangential directions of the circle having the radius (Rn) of 0.5 to 3 mm about the center which is the axial center of the drill bit 4. Furthermore, when the angle $\theta$ is about 65 degrees and the radius Rn is 1 to 1.5 mm, the cooling effect can be enhanced to the largest degree.

It should be noted that the dimensions and the number of the grooves 18 will not be limited to the above-described embodiment but can be set at desired values.

In this embodiment, because a fluid is used as the coolant, and especially because the heat of vaporization of the fluid is utilized for cooling the drill bit, cooling efficiency of the drill bit can be considerably improved. Moreover, by controlling the amount of the cooling fluid to be supplied and the drawing force, it is possible to prevent the cooling fluid from remaining on the printed circuit board after drilling. Therefore, this embodiment is advantageous in that the structure of the pressure foot can be simplified by dispensing with the cooling fluid atomizing nozzle and the support plate which are required in the first embodiment.

We claim:

1. A pressure foot of a printed circuit board drilling apparatus, which is supported on a spindle of the printed circuit board drilling apparatus slidably in the axial direction, and which includes a pressing face which presses a printed circuit board at the time of drilling operation, and a discharge port formed in a side wall so as to discharge chips produced by drilling operation, said discharge port being connected to a suction device, characterized in that a fluid supply circuit for ejecting a cooling fluid toward a drill bit of the printed circuit board drilling apparatus is formed in said side wall, and at least one groove extending in a tangential direction of said drill bit is formed in said pressing face so as to allow the air to be drawn into said pressure foot,
wherein said fluid supply conduit extends in a tangential direction of said drill bit.

* * * * *